US010233091B2

(12) United States Patent
Driessche et al.

(10) Patent No.: US 10,233,091 B2
(45) Date of Patent: Mar. 19, 2019

(54) PROCESS FOR PRODUCING CRYSTALLINE TANTALUM OXIDE PARTICLES

(71) Applicant: BASF SE, Ludwigshafen (DE)

(72) Inventors: Isabel van Driessche, Waasmunster (BE); Katrien De Keukeleere, Zaffelare (BE); Jonathan De Roo, Ghent (BE); Hens Zeger, Ghent (BE)

(*) Notice: Subject to any disclaimer, the term of this patent is extended or adjusted under 35 U.S.C. 154(b) by 0 days.

(21) Appl. No.: 15/554,756

(22) PCT Filed: Jan. 26, 2016

(86) PCT No.: PCT/EP2016/051581
§ 371 (c)(1),
(2) Date: Aug. 31, 2017

(87) PCT Pub. No.: WO2016/139013
PCT Pub. Date: Sep. 9, 2016

(65) Prior Publication Data
US 2018/0044199 A1 Feb. 15, 2018

(30) Foreign Application Priority Data

Mar. 2, 2015 (EP) .................................... 15157159

(51) Int. Cl.
C01G 35/00 (2006.01)
H01L 39/24 (2006.01)
C30B 7/14 (2006.01)
C30B 29/30 (2006.01)

(52) U.S. Cl.
CPC ............... C01G 35/00 (2013.01); C30B 7/14 (2013.01); C30B 29/30 (2013.01); H01L 39/2483 (2013.01); C01P 2002/60 (2013.01); C01P 2002/72 (2013.01); C01P 2004/04 (2013.01); C01P 2004/51 (2013.01); C01P 2004/64 (2013.01)

(58) Field of Classification Search
CPC ................................. C01G 35/00; C30B 7/14
USPC .......................................................... 505/320
See application file for complete search history.

(56) References Cited

U.S. PATENT DOCUMENTS

2005/0159298 A1* 7/2005 Rupich ............... H01L 39/2425
502/100
2010/0117503 A1 5/2010 Mizuno et al.

FOREIGN PATENT DOCUMENTS

| EP | 0 830 218 A1 | 3/1998 |
| EP | 1 198 846 A2 | 4/2002 |
| EP | 1 208 244 B1 | 5/2004 |
| EP | 2 137 330 A2 | 12/2009 |
| WO | WO 2005/095278 A1 | 10/2005 |

(Continued)

OTHER PUBLICATIONS

Machine translation of WO 2013/139843 (2013).*

(Continued)

Primary Examiner — Paul A Wartalowicz
(74) Attorney, Agent, or Firm — Oblon, McClelland, Maier & Neustadt, L.L.P.

(57) ABSTRACT

The present invention is in the field of processes for the production of tantalum oxide particles. In particular the present invention relates to a process for producing crystalline tantalum oxide nanoparticles comprising heating a water-free solution containing (a) a tantalum alkoxide, (b) an acid, and (c) a solvent.

19 Claims, 1 Drawing Sheet

(56) References Cited

FOREIGN PATENT DOCUMENTS

WO    WO 2013/139843 A2    9/2013

OTHER PUBLICATIONS

Peter J. Bonitatibus, Jr., et al., "Preclinical Assessment of a Zwitterionic Tantalum Oxide Nanoparticle X-ray Contrast Agent", ACS Nano, vol. 6 No. 8, 2012, pp. 6650-6658.
R. Kita, et al., "Effect of $Ta_2O_5$ Addition on the Superconducting Properties of $REBa_2Cu_3O_y$,", Physica C: Superconductivity and its Applications, vol. 445-448, Oct. 2006, pp. 391-394.
C. J. V. Oliveira, et al., "Effect of $Ta_2O_5$ addition on the texture of the Y123 Superconductor", Physica C: Superconductivity, vol. 422 No. 3-4, Jun. 1, 2005, pp. 83-87.
U.S. Appl. No. 15/554,742, filed Aug. 31, 2017, Maximilian Hemgesberg, et al.
U.S. Appl. No. 15/064,346, filed Mar. 8, 2016, US 2017/0259947 A1, Alain Cerf.

* cited by examiner

PROCESS FOR PRODUCING CRYSTALLINE TANTALUM OXIDE PARTICLES

The present invention is in the field of processes for the production of tantalum oxide particles. The present invention further relates to crystalline tantalum oxide particles and their use as pinning centers in oxide superconductors.

Tantalum oxide particles have various applications, such as anti-corrosion layer, imaging agent, as photoluminescent and photocatalytic material, as catalyst, or as pinning center for oxide superconductors. In most of these applications, it is advantageous to employ small crystalline nanoparticles. Processes for the production of tantalum oxide particles are known from prior art.

Bonitatibus et al. disclose a tantalum oxide nanoparticle synthesis in ACS Nano, volume 6 (2012), pages 6650-6658.

However, no processes to obtain crystalline particles with a very small particle size have been reported so far. Particles of very small particle size have the advantage that one gram of material constitutes more particles in comparison to particles with bigger particle size which increases the effect of the particles. At the same time crystallinity helps to prevent partial or full dissolution of particles in their environment, particularly when heated to high temperatures. It was therefore an object of the present invention to provide a process to produce crystalline tantalum oxide particles of small particle size. It was aimed at a process which is instrumentally easy and allows facile up-scaling to industrial scales.

These objects were achieved by a process for producing crystalline tantalum oxide particles comprising heating a water-free solution containing
(a) a tantalum alkoxide,
(b) an acid, and
(c) a solvent.

Figure 1:
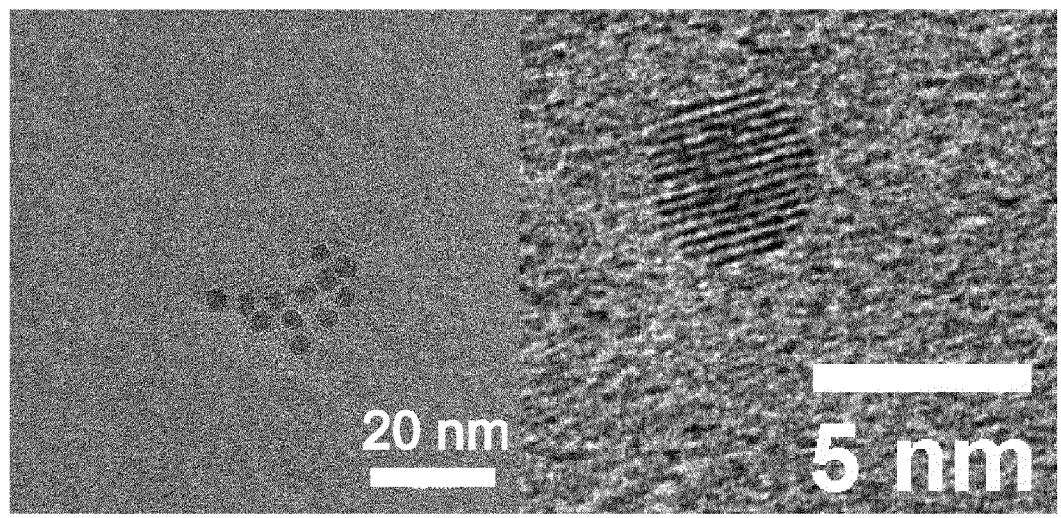
FIG. 1 shows a transmission electron microscopy (TEM) analysis indicating that the particles are uniform in size (5 nm diameter).

The present invention further relates to the use of crystalline particles, which contain tantalum oxide and have a weight average diameter of 1 to 20 nm, as pinning center in superconductors.

Preferred embodiments of the present invention can be found in the description and the claims. Combinations of different embodiments fall within the scope of the present invention. The process according to the present invention comprises heating a water-free solution. Water-free in the context of the present invention typically means that the solution has a water content of less than 500 ppm, preferably less than 200 ppm, in particular less than 100 ppm, such as less than 50 ppm. The term "ppm" refers to parts per million as commonly used. The water content of a solution can be determined by direct titration according to Karl Fischer, for example described in detail in DIN 51777-1 part 1 (1983).

Before heating the solution is preferably homogeneous which means that all compounds are dissolved. The solution is preferably liquid at normal pressure in the range of 0 to 400° C., more preferably in the range of 25 to 350° C., such as 50 to 300° C.

According to the present invention the water-free solution contains a tantalum alkoxide. Preferably, the tantalum in the tantalum alkoxide is in the oxidation state +5. Alkoxides include linear and branched alkoxides. Examples for linear alkoxides are methoxide, ethoxide, n-propyloxide n-butyloxide, n-pentyloxide, n-hexyloxide, n-heptyloxide, n-octyloxide, n-nonyloxide, n-decyloxide. Examples for a branched alkoxides are iso-propyloxide, iso-butyloxide, sec-butyloxide, tert-butyloxide, 2-methyl-pentyloxide, 2-ethylhexyloxide, cyclopropyloxide, cyclohexyloxide, indanyloxide, norbornyloxide. Preferably, the alkoxide is a $C_1$ to $C_{12}$ alkoxide, more preferably a $C_1$ to $C_8$ alkoxide, in particular a $C_1$ to $C_4$ alkoxide. It is possible that the alkoxides in tantalum alkoxide are all the same or different to each other, preferably, they are all the same. Preferred examples for tantalum alkoxides are tantalum(V)-methoxide, tantalum(V)-ethoxide, tantalum(V)-n-butoxide.

The concentration of the tantalum alkoxide in the water-free solution is preferably 10 to 200 mmol/l, more preferably 30 to 150 mmol/l, in particular 50 to 100 mmol/l.

According to the present invention the water-free solution contains an acid. The acid is preferably able to form an ester with the alkoxide of the tantalum alkoxide. Acids include carboxylic acids, phosphonic acids, phosphoric acids, sulfonic acids. Carboxylic acids are preferred. Carboxylic acids include linear saturated acids such as formic acid, acetic acid, propionic acid, butyric acid, valeric acid, caproic acid, heptanoic acid, octanoic acid, nonanoic acid, decanoic acid, undecanoic acid, lauric acid, tridecanoic acid, myristic acid, pentadecanoic acid, palmitic acid, heptadecanoic acid, stearic acid, nonadecylic acid, icosanoic acid. Carboxylic acids further include unsaturated linear acids such as myristoleic acid, palmitoleic acid, sapienic acid, oleic acid, elaidic acid, accenic acid, linoleic acid, linoelaidic acid, arachidonic acid, eicosapentanenoic acid, erucic acid, docosakexaenoic acid. Carboxylic acids further include branched carboxylic acids such as sec-butyric acid or pivalic acid. $C_1$ to $C_{26}$ carboxylic acids are preferred, $C_4$ to $C_{24}$ carboxylic acids are more preferred, in particular $C_8$ to $C_{22}$ carboxylic acids, such as oleic acid.

The molar ratio of the acid to tantalum alkoxide in the water-free solution is preferably 2.5 to 50, more preferably 5 to 30, in particular 10 to 20.

According to the present invention the water-free solution contains a solvent. All solvents which dissolve the tantalum alkoxide and the acid can be used. Non-polar solvents are preferred. Non-polar solvents typically have a dipolar momentum of 1.65 D (Debye) or less, preferably 1.6 D or less, in particular 1.5 D or less. Solvents include hydrocarbons including saturated aliphatic hydrocarbons such as hexane, octane, decane, isoundecane, hexadecane, decalin; unsaturated aliphatic hydrocarbons such as octene, undecene, hexadecene; and aromatic hydrocarbons such as xylene, mesitylene, tetralin, nitrobenzene. Further suitable solvents are ethers such as dihexylether or diphenyl ether; amides such as dimethylformamide or dimethylacetamide; esters such as butyric acid butyl ester, lauric acid ethyl ester; sulfoxides such as dimethylsulfoxide or sulfolane. Hydrocarbons are preferred, $C_6$ to $C_{30}$ hydrocarbons are more preferred, in particular $C_{12}$ to $C_{24}$ hydrocarbons.

According to the present invention the water-free solution is heated. Preferably, the water-free solution is heated to a temperature of 120 to 400° C., more preferably 150° C. to 320° C., in particular 180 to 260° C. The water-free solution is preferably kept at this temperature for 1 min to 5 h, more preferably for 5 to 60 min, in particular 10 to 30 min. The water-free solution is preferably heated at a heating rate of 1 to 100° C./min, more preferably 5 to 50° C./min, in particular 10 to 30° C./min. The heating is usually effected by an electric heating or a heat exchanger of a steam system. Alternatively, microwave-assisted heating is possible. Preferably, the water-free solution is kept in motion upon heating to ensure homogeneous distribution of compounds and heat, for example by stirring.

Without being bound to any theory it is believed that the acid in the water-free solution forms an ester with the alkoxide of the tantalum alkoxide upon heating, thereby providing water in a very small and just sufficient amount which causes the formation of crystalline tantalum oxide particles.

Preferably the water-free solution further contains an amine. Any amine which can be dissolved in the water-free solution can be used. Preferably, primary amines are used, in particular monoalkylamines, wherein the alkyl chain can be linear or branched, can be substituted and can contain unsaturated bonds such as double or triple bonds. Examples for monoalkylamines are decylamine, dodecylamin, hexadecylamine, 2-ethylhexylamine, cyclohexylamine, oleyl amine. The molar ratio of the amine to tantalum is preferably 2.5 to 50, more preferably 5 to 30, in particular 10 to 20.

The process according to the present invention yields crystalline particles containing tantalum oxide. These have a weight average diameter of 1 to 20 nm, preferably 2 to 15 nm, more preferably 3 to 10 nm, in particular 4 to 8 nm. The weight average diameter is preferably measured by dynamic light scattering according to ISO 22412 (2008), preferably by using the Mie theory. The particles have a low dispersity of the particle size distribution $D_{90}/D_{50}$ measured by dynamic light scattering, preferably a $D_{90}/D_{50}$ value of 1.2 or less, more preferably 1.15 or less, in particular 1.1 or less.

The particles are crystalline. Crystalline in the context of the present invention means that the degree of crystallinity of the particles is at least 50%, preferably at least 70%, in particular at least 90%. The degree of crystallinity is defined as the ratio of the weight average radius of the particles visually observed in the HR-TEM and the radius of the particles determined by evaluation of the full width at half maximum (FWHM) of the dominant peak of the X-ray diffraction pattern (XRD) using the Debye-Scherrer equation. A ratio of 1 determines a degree of crystallinity of 100%.

The particles are stable against aggregation when suspended in a non-polar solvent. Preferably, the particles have an acid on their surface which acts as stabilizer, more preferably a carboxylic acid as described above.

The crystalline particles are particularly suitable as pinning centers in oxide superconductors. An advantage of the crystalline particles is that the small particle size yields a high pinning effect while the particles do not partially dissolve during formation of the superconductor at high temperatures and hence do not contaminate the superconductor material. Preferably the superconductor contains $REBa_2Cu_3O_{7-x}$, wherein RE stands for rare earth or yttrium and x is 0.01 to 0.3, more preferably the superconductor contains $YBa_2Cu_3O_{7-x}$.

Preferably the superconductor is made by chemical solution deposition of an ink containing
 (a) an yttrium or rare earth-containing compound,
 (b) a alkaline earth metal-containing compound,
 (c) a transition metal-containing compound,
 (d) an alcohol, and
 (e) the particles according to the invention.

The yttrium- or rare earth metal-containing compound, the alkaline earth metal-containing compound and the transition metal-containing compound include oxides, hydroxides, halogenides, carboxylates, alkoxylates, nitrates or sulfates. Carboxylates are preferred, in particular acetate or propionate. Carboxylates and alkoxylates can be substituted, preferably by fluorine, such as difluoroacetate, trifluoroacetate, or partially or fully fluorinated propionate.

At least one of the rare earth metal or yttrium containing compound, the alkaline earth metal containing compound and the transition metal containing compound contains fluorine. Preferably, the alkaline earth metal containing compound contains fluorine, for example as trifluoroacetate.

Preferably, the yttrium- or rare earth metal is yttrium, dysprosium, or erbium, in particular yttrium. Preferably, the alkaline earth metal is barium. Preferably, the transition metal is copper.

Preferably, the molar ratio of the transition metal-containing compound and yttrium or rare earth metal-containing compound in the ink is between 3:0.7 to 3:2, more preferably 3:1.2 to 3:1.4. Preferably, the molar ratio of the transition metal-containing compound and the earth alkaline metal-containing compound in the ink is between 3:1 to 3:2, more preferably 3:1.7 to 3:1.9.

The ink further contains an alcohol as described for the process above. Preferably, the alcohol is a mixture of methanol and $C_2$ to $C_{12}$ alcohols.

The ink contains the rare earth metal or yttrium containing compound, the alkaline earth metal containing compound and the transition metal containing compound in a molar ratio deemed optimal for the superconductor growth and/or properties, taking into consideration the molar composition of the respective metals in the superconductor to be produced. Their concentration thus depends on the superconductor to be produced. Generally, their concentration in the solution is independent of each other 0.01 to 10 mol/l, preferably 0.1 to 1 mol/l.

Preferably, the ink contains the tantalum oxide particles at a concentration at which the molar ratio of metal in the tantalum oxide particles to the yttrium or rare earth-containing compound is 1 to 30%, more preferably 3 to 20%, in particular 5 to 15%. In many cases this corresponds to 0.1 to 5 weight % of tantalum oxide particles with regard to the ink.

Preferably, the crystalline particles containing tantalum oxide are additionally stabilized by an organic compound containing at least a phosphoric acid group and an ester group or at least two carboxylic acid groups. More preferably the crystalline particles containing tantalum oxide are additionally stabilized by a compound of general formula (I)

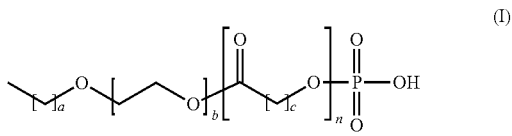

(I)

wherein a is 0 to 5, and
b and c are independent of each other 1 to 14, and
n is 1 to 5.

Preferably, a is 0. Preferably, b is 2 to 10, more preferably 3 to 8. Preferably, c is 2 to 10, more preferably 3 to 6. Preferably, n is 2 to 4. In one preferred example, a is 0, b is 6, c is 5, n is 3.

Also preferably, the organic compound containing at least a phosphoric acid group and an ester group or at least two carboxylic acid groups is a compound of general formula (II)

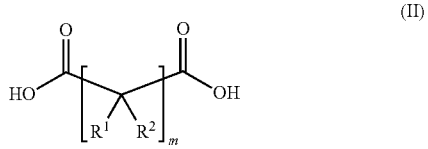

wherein $R^1$ and $R^2$ are independent of each other H, OH, or COOH, and m is 1 to 12.

If m is larger than one, it is possible that the $R^1$ and $R^2$ are all the same or different to each other. Examples for the compound of general formula (II) include dicarboxylic acids in which $R^1$ and $R^2$ are hydrogen, such as malonic acid, succinic acid, glutaric acid, adipic acid, pimelic acid, azelaic acid, sebacic acid; dicarboxylic acids with hydroxyl groups such as tartronic acid, malic acid, tartric acid; or tricarboxylic acids such as citric acid or isocitric acid.

Another preferred organic compound containing at least a phosphoric acid group and an ester group or at least two carboxylic acid groups is a compound of general formula (III)

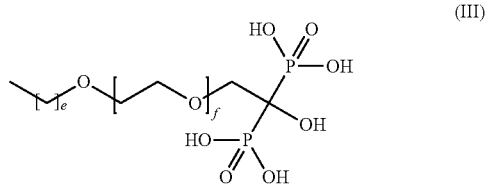

wherein e and f are independent of each other 0 to 12. Preferably e is 0. Preferably, f is 2 to 6.

Another preferred organic compound containing at least a phosphoric acid group and an ester group or at least two carboxylic acid groups is a compound of general formula (IV)

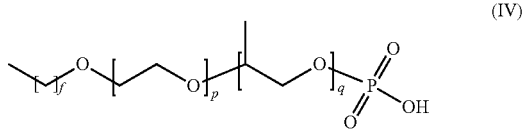

wherein f is 0 to 5, and p and q are independent of each other 1 to 14, preferably 2 to 12. The ratio of p to q is preferably from 20:80 to 80:20, in particular from 40:60 to 60:40.

The organic compound containing at least a phosphoric acid group and an ester group or at least two carboxylic acid groups is brought in contact to the crystalline particles containing tantalum oxide either by precipitating the crystalline particles from a suspension by a highly polar solvent such as acetone, separate the precipitate and redisperse the precipitate in an alcohol with the organic compound containing at least a phosphoric acid group and an ester group or at least two carboxylic acid groups. Alternatively, the organic compound containing at least a phosphoric acid group and an ester group or at least two carboxylic acid groups is added to a suspension of the crystalline particles, a high boiling alcohol is added and the lower-boiling solvent is removed by evaporation.

Preferably the ink further contains stabilizers, wetting agents and/or other additives. The amount of these components may vary in the range of 0 up to 30 weight % relating to the total weight of the dry compounds used. Additives might be needed for adjusting the viscosity. Additives include Lewis bases; amines such as TEA (triethanolamine), DEA (diethanolamine); surfactant; polycarboxylic acids such as PMAA (polymetacrylic acid) and PAA (polyacrylic acid), PVP (polyvinylpyrolidone), ethylcellulose.

Preferably the ink is heated and/or stirred to homogenize all ingredients, such as to reflux. In addition, the ink can further contain various additives to increase the stability of the solution and facilitate the deposition process. Examples for such additives include wetting agents, gelling agents, and antioxidants.

In order to make a superconductor with the ink according to the present invention, the ink is usually deposited on a substrate. The deposition of the ink can be carried out in various ways. The ink can be applied for example by dip-coating (dipping of the substrate in the ink), spin-coating (applying the ink to a rotating substrate), spray-coating (spraying or atomizing the ink on the substrate), capillary coating (applying the ink via a capillary), slot die coating (applying the ink through a narrow slit), and ink-jet printing. Slot die coating and ink-jet printing are preferred.

Preferably, the ink is evaporated after deposition to form a film at a temperature below the boiling point of the solvent, such as 10 to 100° C. below the boiling point of the solvent, preferably 20 to 50° C. below the boiling point of the solvent.

The substrate may be any material capable of supporting buffer and/or superconducting layers. For example suitable substrates are disclosed in EP 830 218, EP 1 208 244, EP 1 198 846, EP 2 137 330. Often, the substrate is a metal and/or alloy strip/tape, whereby the metal and/or alloy may be nickel, silver, copper, zinc, aluminum, iron, chromium, vanadium, palladium, molybdenum, tungsten and/or their alloys. Preferably the substrate is nickel based. More preferably, the substrate is nickel based and contains 1 to 10 at-%, in particular 3 to 9 at-%, tungsten. Laminated metal tapes, tapes coated with a second metal like galvanic coating or any other multi-material tape with a suitable surface can also be used as substrate.

The substrate is preferably textured, i.e. it has a textured surface. The substrates are typically 20 to 200 μm thick, preferably 40 to 100 μm. The length is typically greater than 1 m, the width is typically between 1 cm and 1 m.

Preferably the substrate surface is planarized before the film comprising yttrium or a rare earth metal, an alkaline earth metal and a transition metal is deposited onto, for example by electropolishing. It is often advantageous to subject the thus planarized substrate to a thermal treatment. This thermal treatment includes heating the substrate to 600 to 1000° C. for 2 to 15 minutes, wherein the time refers to the time during which the substrate is at the maximum temperature. Preferably, the thermal treatment is done under reducing atmosphere such as a hydrogen-containing atmosphere. The planarization and/or thermal treatment may be repeated.

Preferably, the surface of the substrate has a roughness with rms according to DIN EN ISO 4287 and 4288 of less than 15 nm. The roughness refers to an area of 10×10 μm within the boundaries of a crystallite grain of the substrate surface, so that the grain boundaries of the metal substrate do not influence the specified roughness measurement.

Preferably, between the substrate and the film there are one or more buffer layers. The buffer layer can contain any material capable of supporting the superconductor layer. Examples of buffer layer materials include metals and metal oxides, such as silver, nickel, $TbO_x$, $GaO_x$, $CeO_2$, yttria-stabilized zirconia (YSZ), $Y_2O_3$, $LaAlO_3$, $SrTiO_3$, $Gd_2O_3$, $LaNiO_3$, $LaCuO_3$, $SrRuO_3$, $NdGaO_3$, $NdAlO_3$ and/or some nitrides as known to those skilled in the art. Preferred buffer layer materials are yttrium-stabilized zirconium oxide (YSZ); various zirconates, such as gadolinium zirconate, lanthanum zirconate; titanates, such as strontium titanate; and simple oxides, such as cerium oxide, or magnesium oxide. More preferably the buffer layer contains lanthanum zirconate, cerium oxide, yttrium oxide, gadolinium-doped cerium oxide and/or strontium titanate. Even more preferably the buffer layer contains lanthanum zirconate and/or cerium oxide.

To enhance the degree of texture transfer and the efficiency as diffusion barrier, multiple buffer layers each containing a different buffer material are between the substrate and the film. Preferably the substrate includes two or three buffer layers, for example a first buffer layer comprising lanthanum zirconate and a second buffer layer containing cerium oxide.

The film is preferable heated to a temperature of 300 to 600° C., preferably 350 to 450° C. to remove remaining organic parts of the precursors. The substrate is kept at this temperature for 1 to 30 min, preferably 5 to 15 min.

Afterwards, the film is preferably heated to a temperature of 700 to 900° C., preferably 750 to 850° C. in an atmosphere containing water and oxygen to crystallize the film. The partial pressure of water is 1 to 99.5% of the total pressure of the atmosphere, and the partial pressure of oxygen is 0.5 to 90% of the total pressure of the atmosphere, preferably 2 to 90%. Even more preferably, during the first stage of heating to 700 to 900° C. the partial pressure of water is 1 to 20% of the total pressure of the atmosphere, preferably 1.5 to 5%, and during the second stage of this heating the partial pressure of water is 90 to 99.5% of the total pressure, preferably 95 to 99%.

Often, the superconductor wire is cut into smaller bands and stabilized by coating with a conductive metal such as copper for example by electrodeposition.

EXAMPLES

Example 1

Figure 2:
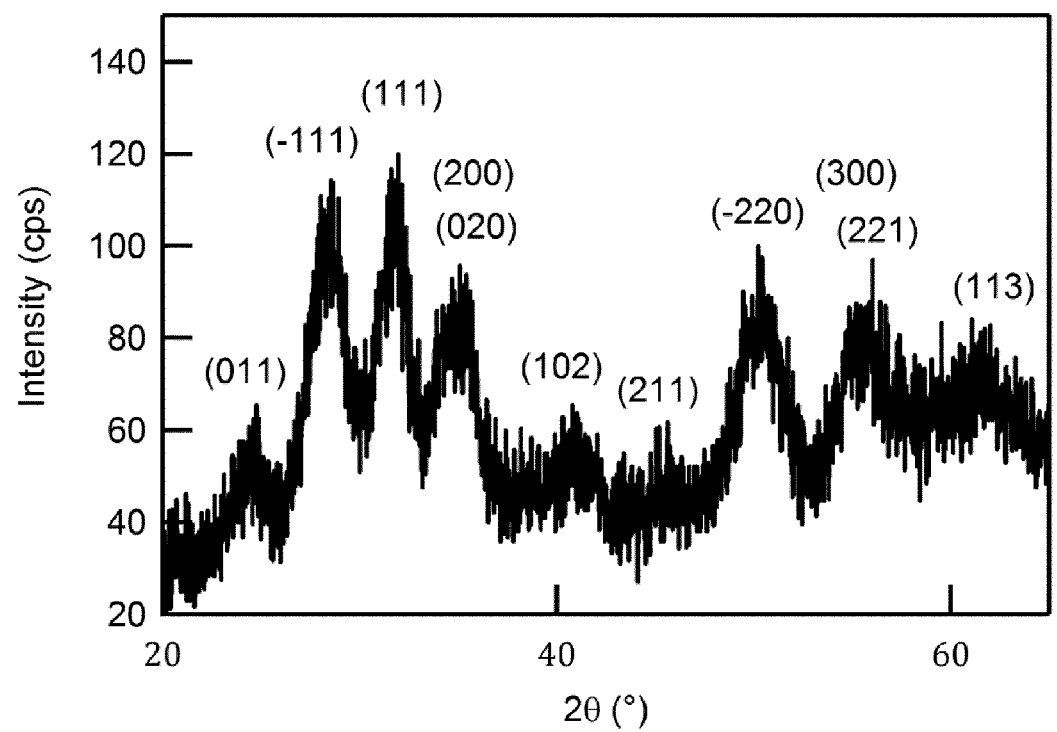
FIG. 2 shows an X-ray diffractogram of the sample obtained.

4.3 mL oleic acid and 9 mL octadecene were degassed under vacuum at 120° C. for one hour. Then, the temperature was raised to 180° C. and 0.25 mL tantalum ethoxide was rapidly injected in the mixture. The reaction mixture was further heated to 260° C. and kept at that temperature for 15 minutes, after which the sample was allowed to cool down to room temperature. The particles were precipitated and redissolved in chloroform. This purification procedure was repeated two times. Transmission electron microscopy (TEM) analysis depicted in FIG. 1 shows that the particles are uniform in size (5 nm diameter) and from the high resolution images it can be concluded that the particles are crystalline. FIG. 2 shows an X-ray diffractogram of the sample obtained, wherein the peaks are assigned to the crystal planes of tantalum oxide.

The invention claimed is:

1. A method for producing a superconductor, the method comprising:
depositing an ink comprising:
(a) an yttrium or rare earth-containing compound,
(b) an alkaline earth metal-containing compound,
(c) a transition metal-containing compound, and
(d) an alcohol, and
(e) crystalline particles
on a substrate, followed by heating to form the superconductor,
wherein said crystalline particles comprise tantalum oxide, have a degree of crystallinity of at least 70%, and have a weight average diameter of 1 to 20 nm.

2. The method according to claim 1, wherein the substrate has multiple buffer layers thereon, and the ink is deposited on a buffer layer furthest from the substrate.

3. The method according to claim 2, wherein the substrate has two buffer layers thereon.

4. The method according to claim 3, wherein a first buffer layer comprises lanthanum zirconate and a second buffer layer comprises cerium oxide.

5. The method according to claim 1, further comprising coating the superconductor with a conductive metal.

6. The method according to claim 5, wherein the conductive metal is copper.

7. The method according to claim 1, wherein said crystalline particles have a weight average diameter of 4 to 8 nm.

8. The method according to claim 7, wherein said crystalline particles have a degree of crystallinity of at least 90%.

9. The method according to claim 1, wherein the superconductor comprises $REBa_2Cu_3O_{7-x}$, wherein RE stands for rare earth and x is from 0.01 to 0.3.

10. The method according to claim 1, wherein the crystalline particles have a particle size distribution $D_{90}/D_{50}$ that is 1.2 or less.

11. The method according to claim 1, wherein the substrate is textured.

12. The method according to claim 1, wherein the substrate has a buffer layer thereon, and the ink is deposited on the buffer layer.

13. The method according to claim 1, wherein the crystalline particles further comprise a compound of formula (I):

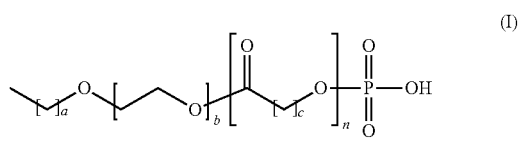

wherein a is 0 to 5, and
b and c are, independent of each other, 1 to 14, and
n is 1 to 5.

14. The method according to claim 1, wherein the crystalline particles further comprise a compound of formula (II):

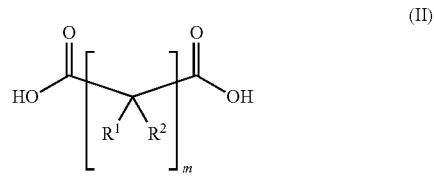

wherein $R^1$ and $R^2$ are, independent of each other, H, OH, or COOH, and
m is 1 to 12.

15. The method according to claim 1, wherein the crystalline particles further comprise a compound of formula (I):

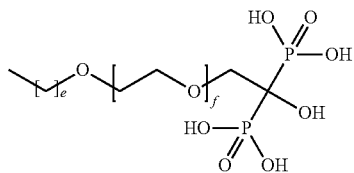
(III)

wherein e and f are, independent of each other, 0 to 12.

16. The method according to claim 1, wherein the crystalline particles further comprise a compound of formula (IV):

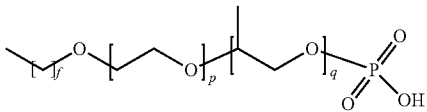
(IV)

wherein f is 0 to 5, and
p and q are, independent of each other, 1 to 14.

17. The method according to claim 1, wherein said crystalline particles have a degree of crystallinity of at least 90%, and have a weight average diameter of 3 to 10 nm.

18. The method according to claim 1, wherein said crystalline particles have a degree of crystallinity of at least 90%.

19. The method according to claim 4, wherein said ink comprises 0.1 to 5 weight % of said crystalline particles with regard to the ink.

* * * * *

UNITED STATES PATENT AND TRADEMARK OFFICE
CERTIFICATE OF CORRECTION

PATENT NO.         : 10,233,091 B2
APPLICATION NO.    : 15/554756
DATED              : March 19, 2019
INVENTOR(S)        : Isabel van Driessche et al.

It is certified that error appears in the above-identified patent and that said Letters Patent is hereby corrected as shown below:

On the Title Page

Item (72), the 4th Inventors' name "Hens Zeger" should read --Zeger Hens--

Signed and Sealed this
Twenty-ninth Day of October, 2019

Andrei Iancu
*Director of the United States Patent and Trademark Office*